United States Patent [19]
Momota et al.

[11] Patent Number: 5,747,218
[45] Date of Patent: May 5, 1998

[54] POSITIVE PHOTORESIST COMPOSITION

[75] Inventors: Makoto Momota; Kenichiro Sato; Shinji Sakaguchi, all of Shizuoka, Japan

[73] Assignee: Fuji Photo Film Co., Ltd., Kanagawa, Japan

[21] Appl. No.: 736,206

[22] Filed: Oct. 25, 1996

[30] Foreign Application Priority Data

Apr. 27, 1995 [JP] Japan .................................. 7-104307
Jan. 18, 1996 [JP] Japan .................................. 8-006697

[51] Int. Cl.$^6$ ...................................... G03F 7/023
[52] U.S. Cl. ........................ 430/192; 430/191; 430/193
[58] Field of Search ............................ 430/165, 192, 430/193, 191

[56] References Cited

U.S. PATENT DOCUMENTS

| | | | |
|---|---|---|---|
| 4,499,171 | 2/1985 | Hosaka et al. | 430/192 |
| 4,957,846 | 9/1990 | Jeffries, III et al. | 430/165 |
| 5,173,389 | 12/1992 | Uenishi et al. | 430/192 |
| 5,340,686 | 8/1994 | Sakaguchi et al. | 430/191 |
| 5,407,779 | 4/1995 | Uetani et al. | 430/192 |
| 5,554,481 | 9/1996 | Kawabe et al. | 430/192 |

*Primary Examiner*—John S. Chu
*Attorney, Agent, or Firm*—Sughrue, Mion, Zinn, Macpeak & Seas, PLLC

[57] ABSTRACT

A positive photoresist composition for ultrafine working ensuring high sensitivity, high resolution, improved film thickness dependency and improved exposure margin, which comprises an alkali-soluble resin and a 1,2-naphthoquinonediazide-5-(and/or -4-)sulfonic ester of a polyhydroxy compound of formula (I), the tetraester component thereof accounting for 50% or more of the entire pattern area determined by high-performance liquid chromatography using ultraviolet rays of 254 nm:

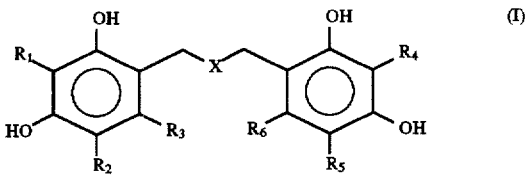

wherein X represents

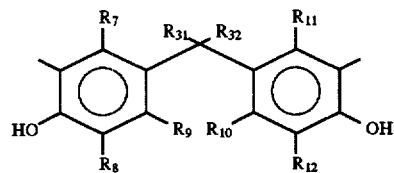

or

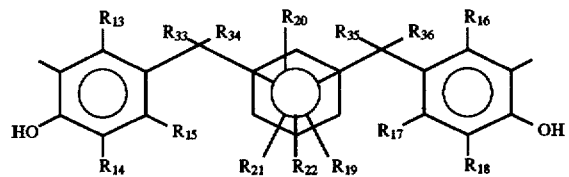

and the substituents other than X are as defined in the specification.

9 Claims, No Drawings

POSITIVE PHOTORESIST COMPOSITION

FIELD OF THE INVENTION

The present invention relates to a positive photoresist composition comprising an alkali-soluble resin and a specific 1,2-quinonediazide compound and sensitive to radiation rays such as ultraviolet ray, far infrared ray, X ray, electron beam, molecular beam, γ ray and synchrotron radiation. More specifically, the present invention relates to a positive photoresist for fine working capable of ensuring high resolution and high sensitivity independent of fluctuation in the film thickness and also providing good development latitude and exposure margin.

BACKGROUND OF THE INVENTION

A positive photoresist is coated on a substrate such as semiconductor wafer, glass, ceramic or gold by a spin coating or roller coating method to have a thickness of from 0.5 to 2 μm. Thereafter, the coating is heated, dried and subjected to printing of a circuit pattern or the like through an exposure mask by ultraviolet ray irradiation, then to post exposure baking, if desired, and to development to form a positive image.

As the positive photoresist composition, a composition comprising an alkali-soluble resin binder such as novolak and a naphthoquinonediazide compound as a photosensitive material is commonly used.

The integrated circuit is more and more being intensified in the integration and in producing a semiconductor substrate for ultra LSI, the working required involves an ultrafine pattern comprising lines having a width of 0.5 μm or less. In this use, the photoresist is particularly demanded to have a wide development latitude so as to stably provide high resolution and always ensure a constant working line width. Further, in order to prevent the working failure of the circuit, the resist pattern after development must have no resist residue.

Also, particularly in forming an ultrafine pattern having a line width of 0.5 μm or less, it is found that even if a desired resolution can be obtained with a certain film thickness, slight change in the coated film thickness causes deteriorated resolution (this phenomenon is hereinafter referred to as "film thickness dependency"). Surprisingly, the resolution greatly varies only with a slight change in the film thickness of several percent μm and any of representative positive photoresists currently available on the market is known to have more or less such a tendency. More specifically, when the thickness of a resist film before exposure changes in the range of λ/4n (λ: exposure wavelength, n: refractive index of the resist film at the wavelength) to a predetermined film thickness, the resolution varies.

With respect to the film thickness dependency, for example, *SPIE Proceedings*, vol. 1925, page 626 (1993) points out the presence of the problem and states that this phenomenon is attributable to multiple reflection effect of light in the resist film.

It is found that in particular, when the contrast of the resist is intensified to obtain a high resolution pattern having a rectangular cross section, the film thickness dependency becomes large in many cases. In actual working for a semiconductor substrate, a pattern is formed using a resist film finely different in the coated thickness depending upon the coated site due to unevenness on the substrate surface or due to uneven coating. Accordingly, the above-described film thickness dependency is one of obstacles to fine working using a positive photoresist, where nearly limiting resolution of the resist is required.

JP-A-7-168355 (the term "JP-A" as used herein means an "unexamined published Japanese patent application") discloses that a positive resist composition having excellent performance in resolution, profile, sensitivity, heat-resistance, depth of focus, etc. can be obtained by the use of the quinonediazidesulfonic acid ester of the following polyhydroxy compound.

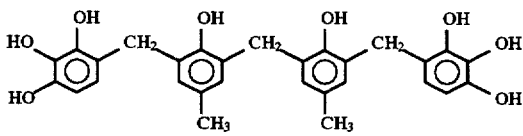

However, the resist obtained therefrom is still insufficient in view of exposure margin. The terminology "exposure margin" as herein means the width of the exposure range between the optimum exposure amount ($E_{opt}$) for resolving a desirable pattern of line and space and the minimum exposure amount ($E_{1rh}$) at which the resolution of the pattern begins. The exposure margin is an important factor in terms of the prevention of lowering of the yield.

SUMMARY OF THE INVENTION

As mentioned above, it has been thoroughly not known how to design the composition of the resist material so as to obtain high sensitivity, high resolution, improved film thickness dependency, and improved exposure margin.

Accordingly, an object of the present invention is to provide a positive photoresist composition for ultrafine working ensuring high sensitivity, high resolution, improved film thickness dependency, and improved exposure margin.

The term "film thickness dependency" as used in the present invention means fluctuation in the resolution of a resist obtained after exposure (baking, if desired) and development, resulting from the change in the film thickness of the resist before exposure in the range of λ/4n.

As a result of extensive investigations taking notice of the above-described various properties, the present inventors have found that the above-described problem can be overcome by a selectively esterified tetraester of a polyhydroxy compound having a specific structure and a quinonediazidesulfonic as a photosensitive material.

That is, the object of the present invention can be achieved by a positive photoresist composition comprising an alkali-soluble resin and a 1,2-naphthoquinonediazide-5-(and/or -4-)sulfonic ester of a polyhydroxy compound represented by the following formula (I), the tetraester component of the 1,2-naphthoquinonediazide-5-(and/or -4-) sulfonic ester of the polyhydroxy compound represented by formula (I) accounting for 50% or more of the entire pattern area determined by high-performance liquid chromatography using ultraviolet rays of 254 nm:

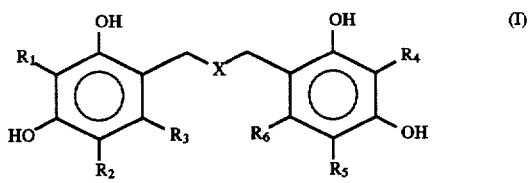

wherein X represents

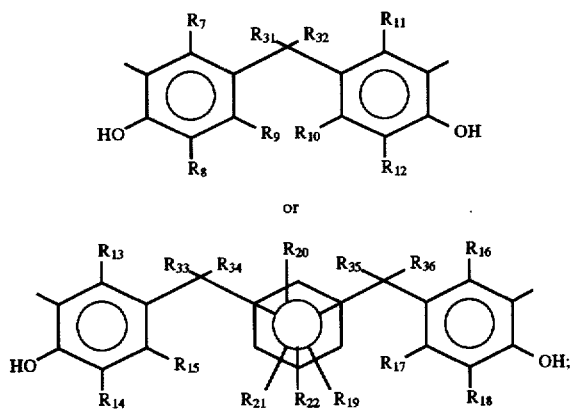

$R_1$ to $R_{18}$, which may be the same or different, each represents a hydrogen atom, a halogen atom, an alkyl group having 1 to 4 carbon atoms, a cycloalkyl group, or an alkenyl group;

$R_{19}$ and $R_{20}$, which may be the same or different, each represents a hydrogen atom, a halogen atom, an alkyl group having 1 to 4 carbon atoms, or an alkenyl group;

$R_{21}$ represents a hydrogen atom, a hydroxyl group, a halogen atom, an alkyl group having 1 to 4 carbon atoms, or an alkenyl group;

$R_{22}$ represents a hydrogen atom, a halogen atom, an alkyl group having 1 to 4 carbon atoms, a cycloalkyl group, an alkenyl group, or an alkoxy group; and $R_{31}$ to $R_{36}$, which may be the same or different, each represents a hydrogen atom or an alkyl group having 1 to 4 carbon atoms, and $R_{31}$ and $R_{32}$, $R_{33}$ and $R_{34}$, or $R_{35}$ and $R_{36}$ may be combined to form a 4 or 5-membered cycloalkane.

In the present invention, when a quinonediazidesulfonic ester of a polyhydroxy compound having the above-described specific structure is used as a photosensitive material, it exhibits improved film thickness dependency and provides high sensitivity, high resolution, and improved exposure margin. The details thereon are not clarified but it is presumed that the above-described peculiar effects come out resulting from properly selecting the number and site of aromatic ring in the polyhydroxy compound, the number of hydroxyl group, the site of the hydroxyl group in the molecule, and the esterification number.

DETAILED DESCRIPTION OF THE INVENTION

The present invention will be explained in more detail below.

In formula (I), the alkyl group represented by $R_1$ to $R_{36}$ is preferably an alkyl group having 1 to 4 carbon atoms (e.g., a methyl group, an ethyl group, a propyl group, an iso-propyl group, a n-butyl group, an iso-butyl group, a sec-butyl group, and a tert-butyl group), and more preferably a methyl group, an ethyl group, a propyl group, and an iso-propyl group.

The halogen atom represented by $R_1$ to $R_{22}$ is preferably a chlorine atom, a bromine atom, and an iodine atom, and more preferably a chlorine atom.

The cycloalkyl group represented by $R_1$ to $R_{18}$ and $R_{22}$ is preferably a cyclopentyl group and a cyclohexyl group.

The alkoxy group represented by $R_{22}$ is preferably a lower alkoxy group having 1 to 4 carbon atoms (e.g., a methoxy group and an ethoxy group), and more preferably a methoxy group.

The alkenyl group represented by $R_1$ to $R_{22}$ is preferably a vinyl group, a propenyl group and an allyl group, and more preferably an allyl group.

In formula (I), $R_1$ to $R_6$ each preferably represents a hydrogen atom, a chlorine atom or a methyl group, $R_7$ to $R_{18}$ each preferably represents a hydrogen atom, a chlorine atom, a methyl group, an ethyl group, a cyclohexyl group, or an allyl group, and $R_{31}$ to $R_{36}$ each preferably represents a hydrogen atom, a methyl group, an ethyl group or an isopropyl group.

$R_{19}$ and $R_{20}$ each preferably represents a hydrogen atom, a chlorine atom, a methyl group, an ethyl group, a cyclohexyl group or an allyl group, and more preferably a hydrogen atom, a methyl group or a cyclohexyl group. $R_{21}$ each preferably represents a hydrogen atom, a hydroxy group, a methyl group, an ethyl group, a cyclohexyl group or an allyl group, and more preferably a hydrogen atom, a hydroxyl group or a methyl group. $R_{22}$ each preferably represents a hydrogen atom, a chlorine atom, a methyl group, an ethyl group, a cyclohexyl group or a methoxy group, and more preferably a hydrogen atom, a methyl group, a cyclohexyl group or a methoxy group.

In the compound represented by formula (I) of the present invention, the aromatic rings are linearly disposed and, it is preferred that the aromatic ring located not at the terminal has a substituent capable of providing electronic or sterical effect of preventing esterification of the hydroxyl group at the 2- or 2,6-position with respect to the hydroxyl group.

Specific examples of the compound represented by formula (I) of the present invention are set forth below. However, the present invention is by no means limited thereto. These compounds may be used either individually or in combination of two or more thereof.

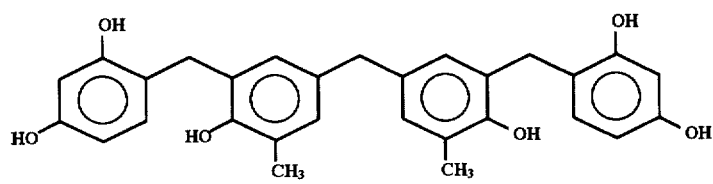

[I-1]

-continued
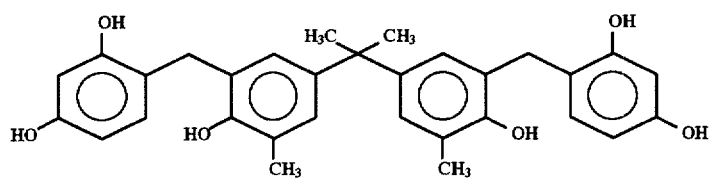 [I-2]
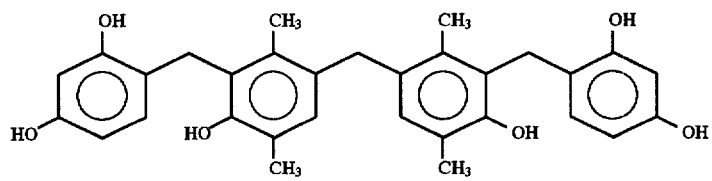 [I-3]
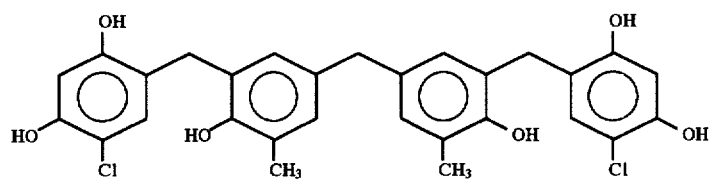 [I-4]
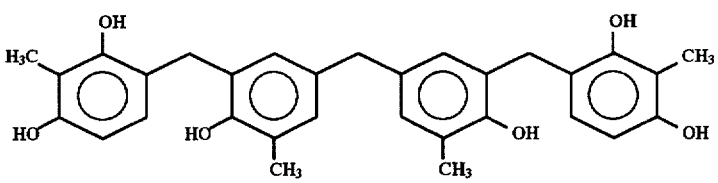 [I-5]
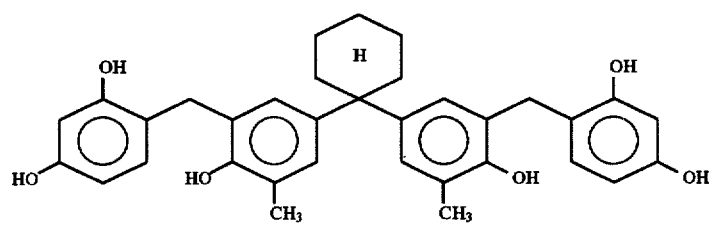 [I-6]
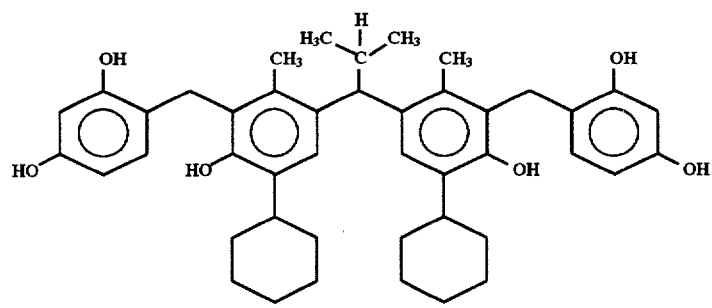 [I-7]
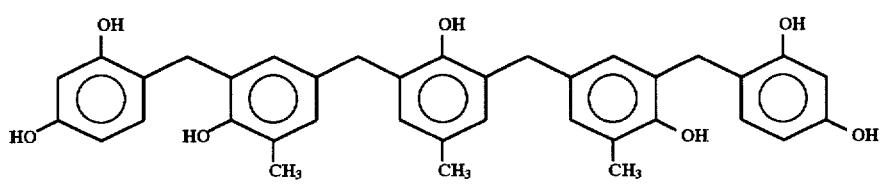 [I-8]

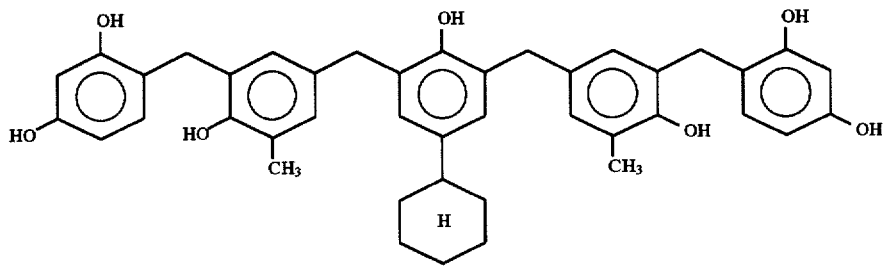 [I-9]
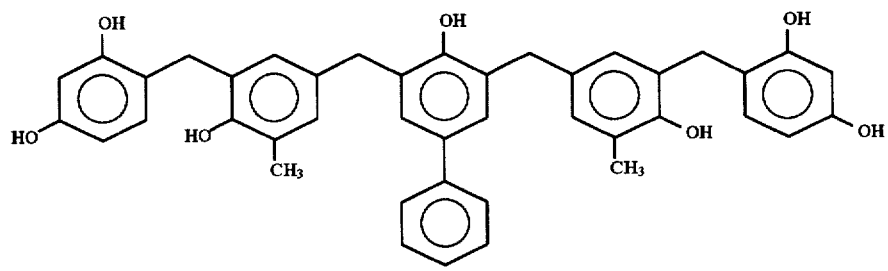 [I-10]
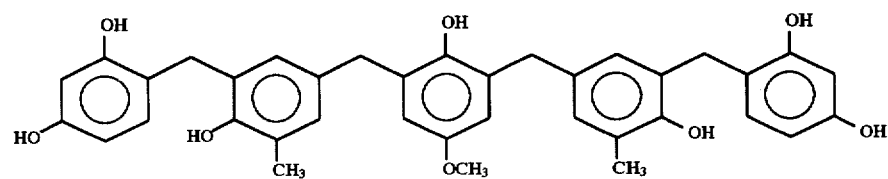 [I-11]
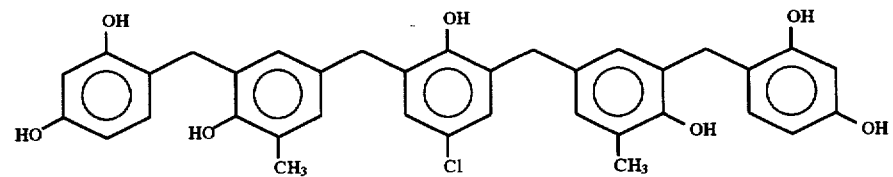 [I-12]
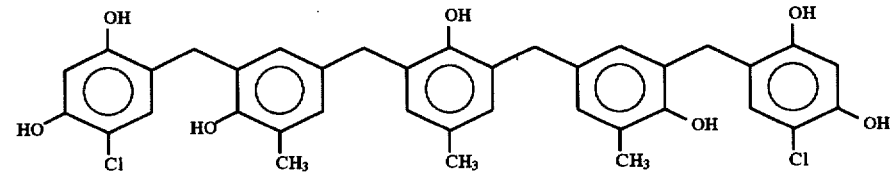 [I-13]
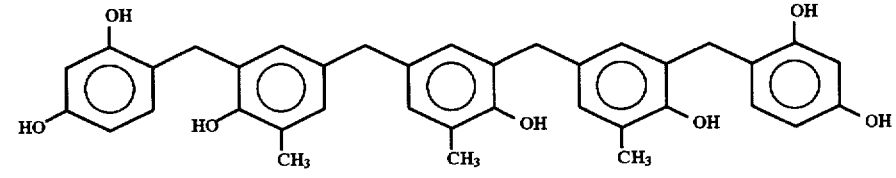 [I-14]
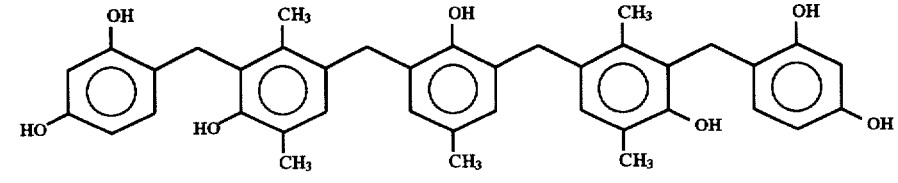 [I-15]

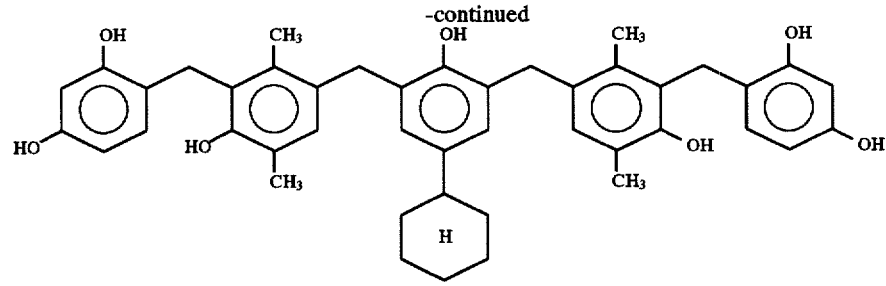

[I-16]

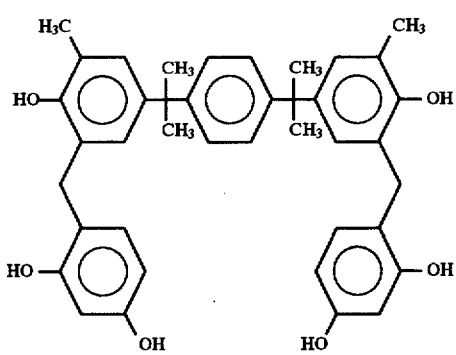

[I-17]     [I-18]

The photosensitive material of the present invention can be obtained by esterifying, for example, the above-described polyhydroxy compound and 1,2-naphthoquinonediazide-5-(and/or-4-)sulfonyl chloride in the presence of a basic catalyst.

More specifically, a polyhydroxy compound, 1,2-naphthoquinonediazide-5-(and/or -4-)sulfonyl chloride and a solvent such as acetone, methyl ethyl ketone, dioxane, dimethoxyethane, tetrahydrofuran, diglyme, ethyl acetate, dichloromethane, chloroform, γ-butyrolactone or N-methylpyrrolidone, each in a predetermined amount are charged into a flask, and thereto a basic catalyst such as sodium hydroxide, sodium carbonate, triethylamine, 4-dimethylaminopyridine, N-methylmorpholine, N-methylpiperazine or N-methylpyrrolidine is added dropwise to effect condensation. The resulting product is crystallized in water, washed with water and purification-dried.

In usual esterification, a mixture of esters different in the esterification number and the esterification site is obtained. However, when the polyhydroxy compound of formula ($I_r$) is used, a tetraester form can be selectively obtained with ease. The tetraester form content needs to be 50% or more of the area in the high-performance liquid chromatography. If the tetraester form content is less than 50%, the effect of the present invention cannot be exerted, the film thickness dependency is large and exposure margin is not improved. The tetraester form content is preferably 55% or more, more preferably 60% or more.

In using the photosensitive compound of the present invention synthesized by the above-described method as a resin composition, the compounds are compounded with an alkali-soluble resin individually or in combination of two or more and the compounding amount is such that the total amount of the photosensitive material of the present invention (1,2-naphthoquinonediazide-5-(and/or -4-)sulfonic ester of a hydroxy compound of formula (I) is generally from 5 to 100 parts by weight, preferably from 20 to 60 parts by weight, per 100 parts by weight of the alkali-soluble resin. If the use ratio is less than 5 parts by weight, the film remaining ratio is liable to be extremely reduced, whereas if it exceeds 100 parts by weight, the sensitivity and the solubility in a solvent are liable to be reduced.

In the present invention, the above-described photosensitive material must be used, but if desired, an esterified product of the following polyhydroxy compounds with 1,2-naphthoquinonediazide-5-(and/or -4-)sulfonyl chloride may be used in combination.

In this case, the ratio of the naphthoquinonediazide ester photosensitive material of these polyhydroxy compounds to the photosensitive material of the present invention is preferably from 20/80 to 80/20 (by weight). In other words, if the photosensitive material of the present invention is less than 20% by weight of the entire photosensitive material, there is a possibility that the-effect of the present invention cannot be exerted sufficiently.

Examples of the polyhydroxy aromatic compound include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone and 2,3,4,3',4',5'-hexahydroxybenzophenone; polyhydroxyphenylalkyl ketones such as 2,3,4-trihydroxyacetophenone and 2,3,4-trihydroxyphenylhexyl ketone; bis((poly)hydroxyphenyl) alkanes such as bis(2,4-dihydroxyphenyl)methane, bis(2,3,4-trihydroxyphenyl)methane and bis (2,4-dihydroxyphenyl)propane-1; polyhydroxybenzoates such as propyl 3,4,5-trihydroxybenzoate and phenyl 3,4,5-trihydroxybenzoate; bis(polyhydroxybenzoyl)-alkanes or bis (polyhydroxybenzoyl)aryls such as bis(2,3,4-trihydroxybenzoyl)methane and bis(2,3,4-trihydroxybenzoyl)-benzene; alkylene di(polyhydroxybenzoates) such as ethylene glycol di(3,5-dihydroxybenzoate); polyhydroxybiphenyls such as 3,5,3', 5'-biphenyltetrol, 2,4,2',4'-biphenyltetrol, 2,4,6,3',5'-biphenylbentol and 2,4,6,2',4',6'-biphenylhexol; polyhydroxytriphenylmethanes such as 4,4',4"-trihydroxy-3,5,3',5'-tetramethyltriphenylmethane, 4,4',4"-trihydroxy-3"-methoxy- 3,5,3',5'-tetramethyltriphenylmethane, 4,4',2"-trihydroxy-3,5,3',5'-tetramethyltriphenylmethane, 4,4',2"-trihydroxy-2,2'-dimethyl-5,5'-dicyclohexyltriphenylmethane, 4,4',2"-trihydroxy-2,5,2',5'- tetramethyltriphenylmethane, 4,4',3",4"-tetrahydroxy-3,5,3', 5'-tetramethyltriphenylmethane, 4,4',2",3",4"-pentahydroxy-3,5,3',5'-tetramethyltriphenylmethane and 2,3,4,2',3',4',3",4"-octahydroxy-5,5'-diacetyltriphenylmethane; polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7'-hexol, 3,3,3',3'-tetramethyl-1,1'-spirobiindane,4,5,6,4',5',6'-hexol and 3,3,3',3'-tetramethyl-1,1'-spirobiindane-4,5,6,5',6',7'-hexol; polyhydroxyphthalides such as 3,3-bis(3,4-dihydroxyphenyl)phthalide, 3,3-bis(2,3,4-trihydroxyphenyl)phthalide, 3',4',5',6'-tetrahydroxyspiro (phthalide-3,9'-xanthene; polyhydroxybenzopyranes such as 2-(3,4-dihydroxyphenyl)-3,5,7-trihydroxybenzopyrane, 2-(3,4,5-trihydroxyphenyl)-3,5,7-trihydroxybenzopyrane, 2-(3,4-dihydroxyphenyl)-3-(3,4,5-trihydroxybenzoyloxy)-5,7-dihydroxybenzopyrane and 2-(3,4,5-trihydroxyphenyl)-3-(3,4,5-trihydroxybenzoyloxy)-5,7-dihydroxybenzopyrane; polyhydroxyphenylchromans such as 2,4,4-trimethyl-2-(2',4'-dihydroxyphenyl)-7-hydroxychroman, 2,4,4-trimethyl-2-(2',3',4'-trihydroxyphenyl)-7,8-dihydroxychroman and 2,4,4-trimethyl-2-(2',4',6'-trihydroxyphenyl)-5,7-dihydroxychroman; hydroxybenzylphenols such as 2,6-bis(2,3,4-trihydroxybenzyl)-4-methylphenol, 2,6-bis(2,4-dihydroxybenzyl)-4-methylphenol, 2,6-bis(5-chloro-2,4-dihydroxybenzyl)-4-methylphenol, 2,6-bis(2,4,6-trihydroxybenzyl)-4-methylphenol, 2,6-bis(2-acetyl-3,4,5-trihydroxybenzyl)-4-methylphenol, 2,4,6-tris(2,3,4-trihydroxybenzyl)phenol, 2,6-bis(3,5-dimethyl-4-hydroxybenzyl)-4-methylphenol, 2,6-bis(2,5-dimethyl-4-hydroxybenzyl)-4-methylphenol, 2,6-bis(2,5-dimethyl-4-hydroxybenzyl)-4-phenylphenol, 2,6-bis(2,5-dimethyl-4-hydroxybenzyl)-4-cyclohexylphenol, 2,6-bis(4-hydroxybenzyl)-4-cyclohexylphenol, 2,6-bis{3'-(4"-hydroxybenzyl)-4'-hydroxy-5'-methylbenzyl}-4-cyclohexylphenol, 2,6-bis{3'-(3"-methyl-4"-hydroxybenzyl)-4'-hydroxy-5'-methylbenzyl}-4-cyclohexylphenol, 2,4,6-tris(3,5-dimethyl-4-hydroxybenzyl)phenol, 4,6-bis(3,5-dimethyl-4-hydroxybenzyl)pyrogallol, 2,6-bis(3-methyl-4-hydroxybenzyl)-4-methylphenol and 2,6-bis(3,5-dimethyl-4-hydroxybenzyl)-phloroglucinol; biphenols such as 2,2'-dihydroxy-5,5'-bis(4"-hydroxybenzyl)biphenol, 2,2'-dihydroxy-3,3'-dimethoxy-5,5'-bis(4"-hydroxybenzyl) biphenol, 2,2'-dihydroxy-3,3'-dimethoxy-5,5'-bis (3",5"-dimethyl-4"-hydroxybenzyl)biphenol, 2,2'-dihydroxy-3,3'-dimethoxy-5,5'-bis(3"-methyl-4"-hydroxybenzyl)biphenol and 4,4'-dihydroxy-3,3'-dimethyl-5,5'-bis-(3",5"-dimethyl-4"-hydroxybenzyl)biphenol; hydroxyphenylalkanes such as 1,3,3,5-tetrakis(4-hydroxyphenyl)pentane, 1,1-bis{3'-(4"-hydroxybenzyl)-4'-hydroxy-5'-methylphenyl}-cyclohexane, 1,1-bis{3'-(3"-methyl-4"-hydroxybenzyl)-4'-hydroxy-5'-methylphenyl}cyclohexane, 1,1-bis{3'-(3",6"-dimethyl-4"-hydroxybenzyl)-4'-hydroxy-5'-methylphenyl}-cyclohexane, 4,4'-methylenebis{2-(4"-hydroxybenzyl)-3,6-dimethylphenol}, 4,4'-methylenebis{2-(3"-methyl-4"-hydroxybenzyl)-3,6-dimethylphenol}, 4,4'-methylenebis{2-(3"-methyl-4"-hydroxybenzyl)-3-cyclohexyl-6-methylphenol}, 4,4'-methylenebis{2-(2",4"-dihydroxybenzyl)-6-methylphenol}, 1,8-bis{3'-(4"-hydroxybenzyl)-4'-hydroxy-5'-methylphenyl}methane and 1,8-bis{3'-(3"-methyl-4"-hydroxybenzyl)-4'-hydroxy-5'-methylphenyl}methane; diphenyl ethers such as 3,3'-bis(4"-hydroxybenzyl)-4,4'-dihydroxy-5,5"-diallyldiphenyl ether, 3,3'-bis{4"-hydroxybenzyl)-4,4'-dihydroxy-5,5"-dimethyldiphenyl thioether,3,3'-bis(3"-methyl-4"-hydroxybenzyl)-4,4'-dihydroxy-5,5"-dimethyldiphenyl thioether, 3,3'-bis(3",6"-dimethyl-4"-hydroxybenzyl)-4,4'-dihydroxy-5,5"-dimethyldiphenyl thioether and 3,3'-bis(3"-methyl-4"-hydroxybenzyl)-4,4'-dihydroxy-5,5"-diallyldiphenyl ether; sulfonamidophenols such as 2,6-bis (4'-hydroxybenzyl)-4-benzenesulfonamidophenol and 2,6-bis(3',6'-dimethyl-4'-hydroxybenzyl)-4-benzenesulfonamidophenol; flavonoid such as quercetin and rutin; and low nuclides of novolak and analogues thereof.

The polymer containing an aromatic hydroxyl group such as acetone-pyrogallol condensed resin or polyvinylphenol may be used in place of the low molecular weight compound. Further, the hydroxyl group of the novolak by itself may be replaced by an appropriate amount of quinonediazide to work also as a photosensitive material or a binder.

Among these, particularly preferred are those having a structure such that three or more aromatic hydroxyl groups are present in total including the moiety having one or more hydroxyl group on the same aromatic ring.

Among these, particularly preferred examples include those having at least three hydroxyl groups in total and a moiety comprising an aromatic group having at least one aromatic hydroxyl group.

Examples of the 1,2-naphthoquinonediazide-5-(and/or -4-)sulfonic ester compound of known aromatic or aliphatic polyhydroxy compounds include compounds described in JP-B-56-2333 (the term "JP-B" as used herein means an "examined Japanese patent publication"), JP-B-62-3411, JP-B-3-2293, JP-B-3-42656, JP-A-58-150948, JP-A-60-154249, JP-A-60-134235, JP-A-62-10646, JP-A-62-153950, JP-A-60-146234, JP-A-62-178562, JP-A-63-113451, JP-A-64-76047, JP-A-1-147538, JP-A-1-189644, JP-A-1-309052, JP-A-2-19846, JP-A-2-84650, JP-A-2-72363, JP-A-2-103543, JP-A-2-285351, JP-A-2-296248, JP-A-2-296249, JP-A-3-48251, JP-A-3-48249, JP-A-3-119358, JP-A-3-144454, JP-A-3-185447, JP-A-4-1652, JP-A-4-60548, JP-A-5-158234, JP-A-5-224410, JP-A-5-303198, JP-A-5-297580, JP-A-5-323597, Japanese Patent Application Nos. 5-251781, 5-251780 and 5-233537, U.S. Pat. Nos. 4,797,345, 4,957,846, 4,992,356, 5,151,340 and 5,178,986, and European Patents 530,148 and 573,056.

Examples of the alkali-soluble resin for use in the present invention include novolak resin, acetone-pyrogallol resin, and polyhydroxystyrene and a derivative thereof.

Among these, particularly preferred is the novolak resin which can be obtained by addition-condensing a predetermined monomer as a main component with an aldehyde in the presence of an acidic catalyst.

Examples of the predetermined monomer include cresols such as phenol, m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, trialkylphenols such as 2,3,5-trimethylphenol and 2,3,4-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol and hydroxy aromatic compounds such as m-chlorophenol, p-chlorophenol, o-chlorophenol, dihydroxybiphenyl, bisphenol A, phenylphenol, resorcinol and naphthol, and these monomers may be used either individually or in combination of two or more thereof, however, the present invention is by not means limited thereto.

Examples of the aldehydes include formaldehyde, paraformaldehyde, acetaldehyde, propylaldehyde, benzaldehyde, phenylacetoaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and an acetalized product of these such as chloroacetaldehydediethylacetal, and among these, formaldehyde is preferred.

These aldehydes are used either individually or in combination.

Examples of the acidic catalyst include a hydrochloric acid, a sulfuric acid, a formic acid, an acetic acid and an oxalic acid.

Also, techniques disclosed in JP-A-60-45238, JP-A-60-94347, JP-A-60-140235, JP-A-60-189739, JP-A-64-14229, JP-A-1-276131, JP-A-2-60915, JP-A-2-275955, JP-A-2-282745, JP-A-4-101147 and JP-A-4-122938, namely, those resulting from removing or reducing the low molecular weight component of the novolak resin are preferably used.

The thus-obtained novolak resin preferably has a weight average molecular weight of from 1,500 to 25,000. If the weight average molecular weight is less than 1,500, the film loss on the unexposed area after development is liable to be large, whereas if it exceeds 25,000, the development rate is liable to be reduced. The weight average molecular weight as used herein is defined by a polystyrene conversion value in gel permeation chromatography.

The dispersibility of the novolalk resin (the ratio of the weight average molecular weight Mw to the number average molecular weight Mn, namely, Mw/Mn) is preferably from 1.5 to 7.0, more preferably from 1.5 to 5.0. If the dispersibility exceeds 7, there is a possibility that the effect of the present invention cannot be achieved, whereas if the dispersibility is less than 1.5, a purification process on a high level is required in the synthesis of the novolak resin and this is unreal in practice and improper.

The weight average molecular weight and the dispersibility of the novolak resin may be properly set depending on the kind of the novolak resin.

In the case when the alkali-soluble resin is a novolak resin synthesized by the condensation reaction of a mixture containing two or more of phenol, cresol, xylenol and trimethylphenol and containing m-cresol as an essential component, with an aldehyde compound, the weight average molecular weight is preferably from 5,500 to 25,000, more preferably from 6,000 to 25,000. The ratio of the weight average molecular weight to the number average molecular weight of the above-described novolak resin is preferably from 1.5 to 5.0.

In the case where the alkali-soluble resin is at least one novolak resin synthesized by the condensation reaction of a mixture containing at least four of p-cresol, o-cresol, 2,3,-xylenol, 2,6-xylenol and trimethylphenol and containing o-cresol as an essential component, with an aldehyde compound, the ratio of the weight average molecular weight to the number average molecular weight is preferably from 1.5 to 5.0 and the weight average molecular weight is preferably from 1,500 to 6,0000.

As described above, depending upon the kind of the novolak resin used, the weight average molecular weight and the dispersibility are properly set to a predetermined range and thereby the effect of the present invention can be provided more outstandingly.

The low molecular weight compound having a phenolic hydroxyl group (water-insoluble alkali-soluble low molecule) which can be used in the present invention is described below.

The composition of the present invention preferably contains a water-insoluble alkali-soluble low molecule for the purpose of acceleration of dissolution in the developer. By containing it, the development latitude can be improved.

Specific examples of the water-insoluble alkali-soluble low molecule include polyhydroxy compounds. Preferred examples of the polyhydroxy compound include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)-propane, 2,2,5,5-tetrakis(4-hydroxyphenyl) hexane, 1,2-tetrakis(4-hydroxyphenyl)ethane, 1,1,3-tris(hydroxyphenyl)butane and para[α,α,α',α'-tetrakis(4-hydroxyphenyl)]xylene.

Among these, water-insoluble alkali-soluble low molecular weight compounds having a total carbon number in one molecule of 60 or less and from 2 to 8 phenolic hydroxyl groups in one molecule are preferred.

Further, the water-insoluble alkali-soluble low molecular weight compound is preferably at least one water-insoluble alkali-soluble low molecular weight compound in which the ratio of the phenolic hydroxyl group to the aromatic ring is from 0.5 to 1.4, the total number of carbon atoms present in the molecule is from 12 to 60, and the number of the phenolic hydroxyl groups present in the molecule is from 2 to 10. Among these, particularly preferred are the compounds which, upon addition to a water-insoluble alkali-soluble resin, increase the alkali dissolution rate of the alkali-soluble resin. By using such a compound, the development latitude may be still further improved.

If the carbon number of the compound exceeds 60, the effect of the present invention is liable to be reduced, whereas if it is less than 12, other problems such as reduction in the heat resistance may newly arise. In order to achieve the effect of the present invention, it is necessary to have at least two hydroxyl groups in the molecule, but if the number of hydroxyl groups exceeds 10, the improvement effect on the development latitude may be lost. Further, if the ratio of the phenolic hydroxyl group to the aromatic ring is less than 0.5, the film thickness dependency liable to be large and also, the development latitude is liable to be narrow, whereas if the ratio exceeds 1.4, there is a possibility that the stability of the composition is deteriorated and it becomes disadvantageously difficult to obtain high resolution and good film thickness dependency.

The preferred addition amount of the low molecular weight compound is from 1 to 100% by weight, more preferably from 2 to 80% by weight, based on the alkali-soluble resin. If the addition amount exceeds 100% by weight, other problems such as worsening of the development residue or deformation of a pattern upon development disadvantageously arise.

The water-insoluble alkali-soluble low molecular weight compound having an aromatic hydroxyl group for use in the present invention can be easily synthesized by one skilled in the art by referring to the description, for example, in JP-A-4-122938, JP-A-2-28531, JP-A-2-242973, JP-A-2-275995, JP-A-4-251849, JP-A-5-303199, JP-A-5-22440, JP-A-6-301204, U.S. Pat. Nos. 4,916,210, 5,210,657 and 5,318,875 and European Patent 219,294.

Examples of the solvent in which the photosensitive material and the alkali-soluble novolak resin for use in the present invention are dissolved include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cylohexanone, 4-methoxy-4-methyl-2-pentanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate and butyl acetate. These organic solvent are used individually or in combination of two or more thereof.

Further, a high boiling point solvent such as N-methylformamide, N,N-dimethylformamide, N-methylacetamide, N,N-dimethylacetamide, N-methylpyrrolidone, dimethylsulfoxide or benzyl ethyl ether may be used in combination.

The positive photoresist composition of the present invention may contain a surface active agent so as to improve coatability such as striation.

Examples of the surface active agent include a nonionic surface active agent such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), sorbitan fatty acid esters (e.g., sorbitan monolaurate, sorbitan monopalmitate, sorbitan monostearate, sorbitan monooleate, sorbitan trioleate, sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-base surface active agent such as Eftop EF301, EF303, EF352 (produced by Shin Akita Kasei KK), Megafac F171, F173 (produced by Dainippon Ink & Chemicals, Inc.), Florade FC430, 431 (produced by Sumitomo 3M KK), Asahiguard AG710, Surfron S-382, SC101, SC102, SC103, SC104, SC105 and SC106 (produced by Asahi Glass KK); an organosiloxane polymer KP341 (produced by Shin-Etsu Chemical Co., Ltd.); and an acrylic acid-base or methacrylic acid-base (co)polymer, Polyflow No. 75, No. 95 (produced by Kyoei Sya Yushi Kagaku Kogyo KK). The compounding amount of the surface active agent is usually 2 parts by weight or less, preferably 1 part by weight or less, per 100 parts by weight of the alkali-soluble resin and the quinonediazide compound in the composition.

These surface active agents may be added individually or in combination of several compounds.

The developer for the positive photoresist composition of the present invention may be an aqueous solution of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcoholamines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). Further, to the aqueous solution of the above-described alkali, an alcohol such as isopropyl alcohol or a surface active agent such as a nonionic surface active agent may be added in an appropriate amount.

The positive photoresist composition of the present invention may contain a light absorbent, a crosslinking agent or an adhesion aid, if desired. The light absorbent is used, if desired, for the purpose of preventing halation from the substrate or increasing visibility when the composition is coated on a transparent substrate. Preferred examples of the light absorbent include commercially available light absorbents described in *Kogyo-yo Shikiso no Giiutsu to Shijo* (Technique and Market of Industrial Dyes), CMC Shuppan, and *Senryo Binran* (Dye Handbook), Yuki Gosei Kagaku Kyokai (compiler), such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10 and C.I. Pigment Brown 2. The light absorbent is usually compounded in an amount of 100 parts by weight or less, preferably 50 parts by weight or less, more preferably 30 parts by weight or less, per 100 parts by weight of the alkali-soluble resin.

The crosslinking agent is used in the range such that the formation of a positive image is not influenced. The object of adding a crosslinking agent is mainly to control sensitivity, to improve heat-resistance and to improve dry etching durability.

Examples of the crosslinking agent include a compound resulting from letting formaldehyde act on melamine, benzoguanamine or glycoluril, an alkyl-modified product thereof, an epoxy compound, an aldehyde, an azide compound, an organic peroxide and hexamethylenetetramine. The crosslinking agent may be compounded in a proportion of less than 10 parts by weight, preferably less than 5 parts by weight, per 100 parts by weight of the photosensitive material. If the compounding amount of the crosslinking agent exceeds 10 parts by weight, the sensitivity is liable to be reduced and scum (resist residue) is generated, thus this is not preferred.

The adhesion aid is added mainly for the purpose of improving adhesion of the resist to the substrate, particularly for preventing the peeling off of the resist during etching. Specific examples of the adhesion aid include chlorosilanes such as trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole and mercaptopyrimidine, and urea or thiourea compounds such as 1,1-dimethylurea and 1,3-dimethylurea.

The adhesion aid is compounded in a proportion of usually less than 10 parts by weight, preferably less than 5 parts by weight, per 100 parts by weight of the alkali-soluble resin.

The above-described positive photoresist composition is coated on a substrate used in the production of precision integrated circuit element (for example, transparent substrate such as silicon/silicon dioxide coating, glass substrate or ITO substrate) by an appropriate coating method such as spin coating, roll coating, flow coating, dip coating, spray coating or doctor coating, and then pre-baked, exposed through a predetermined mask, subjected to post exposure baking (if desired), developed, rinsed and dried, and thereby a good resist can be obtained.

EXAMPLES

The present invention is described in greater detail below, but the present invention should not be construed as being limited thereto. Unless otherwise indicated, the "%" indicates "% by weight".

Example 1

Synthesis Example (1)

Synthesis of Compound (I-1)

Into a four-necked flask equipped with a stirrer, a reflux condenser tube, a thermometer and a drip feeder, 114 g of bis(3-methyl-4-hydroxyphenyl)methane, 456 g of a 25% aqueous solution of tetramethylammonium hydroxide and 50 ml of distilled water were charged, the mixture was stirred at room temperature to completely dissolve the bis(3-methyl-4-hydroxyphenyl)methane, 242 g of a 37% aqueous formalin solution was added dropwise thereto and the mixture was stirred as it was for 12 hours. The resulting reaction mixed solution was neutralized with a 1% aqueous hydrochloric acid solution and the white solid deposited was recovered by filtration to obtain 103 g of a methylol product.

Into a similar reaction apparatus, 91 g of the methylol product obtained above, 1.32 kg of resorcin, 8 g of para-toluene sulfonic acid monohydrate and 2.4 l of methanol were charged and the mixture was uniformly heated and stirred under reflux. The mixed solution was stirred as it was for 8 hours and crystallized in 24 l of ice water and the white solid deposited was recovered by filtration. The resulting white solid was recrystallized in distilled water to obtain 56.7 g of Compound (I-1).

Synthesis Example (2)

Synthesis of Compound (I-2)

Compound (I-2) was synthesized by the same operation as in Synthesis Example (1) except for using 2,2-bis(3-methyl-4-hydroxyphenyl)propane in place of (3-methyl-4-hydroxyphenyl)methane.

Synthesis Example (3)

Synthesis of Compound (I-3)

Into a four-necked flask equipped with a stirrer, a reflux condenser tube, a thermometer and a drip feeder, 128 g of bis(2,5-dimethyl-4-hydroxyphenyl)methane, 1 l of ethanol and 450 g of a 50% aqueous dimethylamine solution were charged and completely dissolved, 400 g of a 37% aqueous formalin solution was added dropwise thereto over 1 hour and the mixture was reacted under reflux. The white solid deposited was recovered by filtration and washed with water to obtain 176 g of an aminomethyl product.

Into a similar reaction apparatus, 148 g of the aminomethyl product obtained above and 1.63 kg of acetic anhydride were charged and the mixture was reacted under reflux for 24 hours. The resulting reaction mixed solution was concentrated under reduced pressure, the concentrate was crystallized with water and the brown solid deposited was recovered by filtration to obtain 152 g of an acetoxy product.

Into a similar reaction apparatus, 120 g of the acetoxy product obtained above, 990 g of resorcin, 6 g of paratoluenesulfonic acid monohydrate and 1.8 l of methanol were charged and the mixture was uniformly heated and stirred under reflux. The resulting reaction mixed solution was stirred as it was for 8 hours and crystallized with 18 l of ice water and the brown solid deposited was recovered by filtration. The solid obtained was recrystallized in distilled water to obtain 45.0 g of Compound (I-3).

Synthesis Example (4)

Synthesis of Compound (I-11)

Into a four-necked flask equipped with a stirrer, a reflux condenser tube, a thermometer and a drip feeder, 84 g of bis(hydroxymethylene)-p-cresol, 324 g of o-cresol and 1 l of methanol were charged, stirred and made uniform, 5 g of concentrated sulfuric acid was added thereto, and the mixture was heated for 4 hours while stirring under reflux. After completion of the reaction, the reaction solution was crystallized in 10 l of distilled water and the resulting solid was washed with a mixed solvent of hexane and toluene to obtain 143 g of trinuclide as a white solid.

Into a similar reaction apparatus, 105 g of the trinuclide obtained above, 410 g of a 25% aqueous solution of tetramethylammonium hydroxide and 50 ml of distilled water were charged, stirred and made uniform, 146 g of a 37% aqueous formalin solution was added dropwise, and the mixture was stirred as it was for 8 hours. The resulting reaction mixed solution was neutralized with a 1% aqueous hydrochloric acid solution and the white solid precipitated was recovered by filtration to obtain 104 g of a trinuclide methylol product.

Into a similar reaction apparatus, 82 g of the trinuclide methylol product obtained above, 660 g of resorcin and 1.2 l of methanol were charged and heated while stirring under reflux to make the mixture uniform. The mixed solution was stirred as it was for 8 hours and recrystallized in 12 l of ice water, and the white solid deposited was recovered by filtration. The resulting white solid was recrystallized in distilled water to obtain 35.6 g of Compound (I-11).

Synthesis Example (5)

Synthesis of Photosensitive Material a

Into a three-necked flask, 47.3 g of Compound (I-1), 107.5 g of 1,2-naphthoquinonediazide-5-sulfonyl chloride and 1.0 l of acetone were charged and uniformly dissolved. Then, 41.7 g of N-methylpiperidine was gradually added dropwise and reacted at 25° C. for 3 hours. The reaction mixed solution was poured into 3.2 l of a 1% aqueous hydrochloric acid solution and the precipitate generated was separated by filtration, washed with water and dried (at 40°

C.) to obtain 126.1 g of 1,2-naphthoquinonediazide-5-sulfonic ester of Compound (I-1) (Photosensitive Material a).

In a high-performance liquid chromatography determined by means of a detector using ultraviolet rays of 254 nm, the tetraester form of Photosensitive Material a accounted for 64% of the entire pattern area.

The determination of the above-described high-performance liquid chromatography was conducted in a chromatography apparatus LC-6A manufactured by Shimadzu Corporation with columns Nova-Pak C18 (4 µm) of 8 mmφ×100 mm manufactured by Waters Co., Ltd, using a solution consisting of 68.6% of distilled water, 30.0% of acetonitrile, 0.7% of triethylamine and 0.7% of phosphoric acid as a carrier solvent, at a flow rate of 2.0 ml/min.

Synthesis Example (6)

Synthesis of Photosensitive Material b

To a three-necked flask, 50.1 g of Compound (I-2), 107.5 g of 1,2-naphthoquinonediazide-5-sulfonyl chloride and 1.0 l of acetone were charged and uniformly dissolved. Then, 41.7 g of N-methylpiperidine was gradually added dropwise and reacted at 25° C. for 3 hours. The reaction mixed solution was poured into 3.2 l of a 1% aqueous hydrochloric acid solution and the precipitate generated was separated by filtration, washed with water and dried (at 40° C.) to obtain 128.7 g of 1,2-naphthoquinonediazide-5-sulfonic ester of Compound (I-2) (Photosensitive Material b).

In a high-performance liquid chromatography determined by means of a detector using ultraviolet rays of 254 nm, the tetraester form of Photosensitive Material b accounted for 65% of the entire pattern area.

Synthesis Example (7)

Synthesis of Photosensitive Material c

To a three-necked flask, 50.1 g of Compound (I-3), 107.5 g of 1,2-naphthoquinonediazide-5-sulfonyl chloride and 1.0 l of acetone were charged and uniformly dissolved. Then, 41.7 g of N-methylpiperidine was gradually added dropwise and reacted at 25° C. for 3 hours. The reaction mixed solution was poured into 3.2 l of a 1% aqueous hydrochloric acid solution and the precipitate generated was separated by filtration, washed with water and dried (at 40° C.) to obtain 129.7 g of 1,2-naphthoquinonediazide-5-sulfonic ester of Compound (I-3) (Photosensitive Material c).

In a high-performance liquid chromatography determined by means of a detector using ultraviolet rays of 254 nm, the tetraester form of Photosensitive Material c accounted for 66% of the entire pattern area.

Synthesis Example (8)

Synthesis of Photosensitive Material d

To a three-necked flask, 59.3 g of Compound (I-11), 107.5 g of 1,2-naphthoquinonediazide-5-sulfonyl chloride and 1.5 l of acetone were charged and uniformly dissolved. Then, 41.7 g of N-methylpiperidine was gradually added dropwise and reacted at 25° C. for 3 hours. The reaction mixed solution was poured into 5.0 l of a 1% aqueous hydrochloric acid solution and the precipitate generated was separated by filtration, washed with water and dried (at 40° C.) to obtain 136.9 g of 1,2-naphthoquinonediazide- 5-sulfonic ester of Compound (I-11) (Photosensitive Material d).

In a high-performance liquid chromatography determined by means of a detector using Ultraviolet rays of 254 nm, the tetraester form of Photosensitive Material d accounted for 58% of the entire pattern area.

Synthesis Example (9)

Comparative Photosensitive Material e

To a three-necked flask, 5.0 g of the polyhydroxy compound shown below, 13.4 g of 1,2-naphthoquinonediazide-5-sulfonyl chloride and 150 ml of acetone were charged and uniformly dissolved. Then, 5.9 g of N-methylpiperidine was gradually added dropwise and reacted at 25° C. for 3 hours. The reaction mixed solution was poured into 500 ml of a 1% aqueous hydrochloric acid solution and the precipitate generated was separated by filtration, washed with water and dried (at 40° C.) to obtain 14 g of photoesnsitive material (Comparative Photo-sensitive Material e).

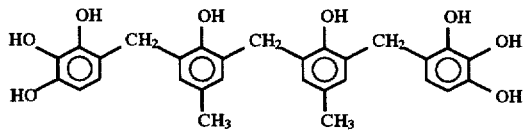

In a high-performance liquid chromatography determined by means of a detector using ultraviolet rays of 254 nm, the tetraester form of Photosensitive Material e accounted for 25% of the entire pattern area.

Synthesis Example (10)

Comparative Photosensitive Material f

To a three-necked flask- 50.1 g of polyhydroxy compound (I-2), 134.4 g of 1,2-naphthoquinonediazide-5-sulforlyl chloride and 1.0 liter of acetone were charged and uniformly dissolved. Then, 56.2 g of N-methylpiperidine was gradually added dropwise and reacted at 25° C. for 3 hours. The reaction mixed solution was poured into 5.0 liter of a 1% aqueous hydrochloric acid solution and the precipitate generated was separated by filtration, washed with water and dried (at 40° C.) to obtain 145 g of photoesnsitive material (Comparative Photosensitive Material f).

In a high-performance liquid chromatography determined by means of a detector using ultraviolet rays of 254 nm, the tetraester form of Photosensitive Material f accounted for 42% of the entire pattern area.

Synthesis Example (11)

Synthesis of Novolak Resin A

To a three-necked flask, 43 g of m-cresol, 57 g of p-cresol, 49 g of a 37% aqueous formalin solution and 0.13 g of oxalic acid were charged, the temperature was raised to 100° C. while stirring, and the mixture was reacted for 15 hours.

Thereafter, the temperature was raised to 200° C., the pressure was gradually reduced to 5 mmHg and water, unreacted monomer, formaldehyde and oxalic acid were removed. The melted alkali-soluble novolak resin was recovered by lowering the temperature to room temperature. Novolak Resin A obtained had a weight average molecular weight of 7,800 (in terms of polystyrene) and a dispersibility of 0.10.

Synthesis Example (12)

Synthesis of Novolak Resin B

11 Grams of p-cresol, 8 g of o-cresol, 69 g of 2,3-dimethylphenol, 20 g of 2,3,5-trimethylphenol and 4.9 g of 2,6-dimethylphenol were mixed with 50 g of diethylene glycol monomethyl ether and the mixture was charged into a three-necked flask equipped with a stirrer, a reflux condenser tube and a thermometer. Then, 85 g of a 37% aqueous formalin solution was added thereto and the mixture was stirred while heating in an oil bath at 110° C. When the inner temperature reached 90° C., 6.3 g of oxalic acid dihydrate was added. Thereafter, the reaction was continued for 18 hours while keeping the temperature of the oil bath at 130° C., the reflux condenser tube was then removed and the content was distilled at 200° C. under reduced pressure to remove unreacted monomers. The resulting novolak resin had an Mw of 3,350 and a dispersibility of 2.55.

Synthesis Example (13)

Synthesis of Novolak Resin C

To a three-necked flask, 50 g of m-cresol, 3 g of p-cresol, 52.6 g of 2,5-xylenol, 53 g of a 37% aqueous formalin solution and 0.15 g of oxalic acid were charged, the temperature was raised to 100° C. while stirring and the mixture was reacted for 14 hours.

Thereafter, the temperature was raised to 200° C., the pressure was gradually reduced-to 1 mmHg and water, unreacted monomer, formaldehyde and oxalic acid were removed. The melted novolak resin was recovered by lowering the temperature to room temperature. The novolak resin obtained had a weight average molecular weight of 3,500 (in terms of polystyrene). Then, 20 g of the novolak resin was completely dissolved in 60 g of methanol and thereto, 30 g of water was gradually added while stirring to precipitate the resin component. The upper layer was removed by decantation and the precipitated resin component was recovered, heated at 40° C. and dried for 24 hours under reduced pressure to obtain Alkali-Soluble Novolak Resin B. The novolak resin obtained had a weight average molecular weight of 4,900 (in terms of polystyrene) and a dispersibility of 3.20. The monomer, dimer and trimer contents were 0%, 2.1% and 3.3%, respectively, and 38% of the low molecular weight component was removed by fractional reprecipitation.

Synthesis Example (14)

Synthesis of Novolak Resin D

To a three-necked flask, 60 g of m-cresol, 18 g of p-cresol, 25 g of 2,3,5-trimethylphenol, 56 g of a 37% aqueous formalin solution and 0.16 g of oxalic acid were charged, the temperature was raised to 100° C. while stirring and the mixture was reacted for 16 hours.

Thereafter, the temperature was raised to 200° C., the pressure was gradually reduced to 1 mmHg and water, unreacted monomer, formaldehyde and oxalic acid were removed. The melted novolak resin was recovered by lowering the temperature to room temperature. The novolak resin obtained had a weight average molecular weight of 3,900 (in terms of polystyrene). Then, 20 g of the novolak resin was completely dissolved in 60 g of methanol, 60 g of hexane was gradually added thereto while stirring, the mixture was allowed to stand for 2 hours, the upper layer was removed by decantation, and the precipitated resin component was recovered, heated at 40° C. and dried for 24 hours under reduced pressure to obtain Alkali-Soluble Novolak Resin C. The novolak resin obtained had a weight average molecular weight of 7,800 (in terms of polystyrene) and a dispersibility of 3.20. The monomer, dimer and trimer contents were 0%, 2.1% and 3.2%, respectively, and 52% of the low molecular weight component was removed by fractional reprecipitation.

Preparation of Positive Photoresist Composition and Evaluation

Photosensitive Materials a to f obtained in Synthesis Examples (1) to (10), Novolak Resins A to D obtained in Synthesis Examples (11) to (14), 22.8 g of ethyl lactate and a polyhydroxy compound (optionally) were mixed at a proportion shown in Table 1, and each solution was made uniform and filtered through a Teflon-made microfilter having a pore size of 0.10 μm to prepare photoresist compositions. Each photoresist composition was coated on a silicon wafer by means of a spinner while adjusting the revolution number so as to obtain a predetermined thickness, and the coating was dried on a vacuum adhesion type hot plate at 90° C. for 60 seconds to obtain a photoresist film having a film thickness of 0.98 μm or 1.00 μm.

Each film was exposed using a reduction projection exposure apparatus (reduction projection exposure apparatus NSR-2005i9C, manufactured by Nikon Corporation), subjected to PEB at 110° C. for 60 seconds, developed with a 2.38% aqueous solution of tetramethylammonium hydroxide for one minute, washed with water for 30 seconds and dried.

Each of the thus-obtained resist patterns on a silicon wafer was observed through a scanning electron microscope and the resist was evaluated. The results obtained are shown in Table 2.

Sensitivity

The sensitivity was defined by a reciprocal of the exposure amount necessary for reproducing a mask pattern of 0.60 μm and shown by a relative value to the sensitivity of the resist film having a film thickness of 0.98 μm of Comparative Example 2.

Resolution

The resolution shows a threshhold resolution at an exposure amount necessary for producing a mask pattern of 0.50 μm.

Film Thickness Dependency

The ratio of the resolution at a film thickness of 0.98 μm to the resolution at a film thickness of 1.00 μm was used as an index for the film thickness dependency. The value closer to 1.0 reveals that the film thickness dependency is smaller.

Development Residue

Development residue was observed under the condition that the film thickness was 0.98 μm and the resist pattern was 0.60 μm. When no residue was observed, the sample was rated as "A". When residue was observed, it was rated as "B".

Exposure Margin

The exposure margin was evaluated at a film thickness of 0.98 μm according to the following equation.

$$\text{Exposure Margin} = (E_{opt} - E_{1th}) / \{(E_{opt} + E_{1th})/2\}$$

$E_{opt}$: the optimum exposure amount for reproducing a mask pattern of 0.60 μm $E_{1th}$: the minimum exposure amount which the resolution of the pattern begins at.

The larger the obtained value is, the wider the exposure margin is.

TABLE 1

Formulation of Positive Photoresist Composition

| | Novolak Resin | | Polyhydroxy Compound | | Photosensitive Material | |
|---|---|---|---|---|---|---|
| | Kind | (g) | Kind | (g) | I (g) | II (g) |
| Example | | | | | | |
| 1 | A | 5.04 | none | | a 2.16 | none |
| 2 | B | 4.10 | P-3 | 1.368 | a 1.73 | none |
| 3 | C | 3.68 | " | 1.36 | a 1.08 | S-2 1.08 |
| 4 | D | 3.68 | " | 1.36 | a 1.296 | S-2 0.864 |
| 5 | B | 3.73 | " | 1.31 | a 2.16 | none |
| 6 | B | 3.73 | " | 1.31 | b 2.16 | none |
| 7 | B | 3.73 | " | 1.31 | c 2.16 | none |
| 8 | B | 3.73 | " | 1.31 | d 2.16 | none |
| 9 | C | 3.47 | P-1 | 1.28 | c 1.71 | S-2 0.734 |
| 10 | C | 3.47 | P-2 | 1.28 | c 1.96 | S-2 0.49 |
| 11 | C | 3.47 | P-4 | 1.28 | c 1.96 | S-2 0.49 |
| 12 | D | 3.468 | P-1/P-5 | 0.898/ 0.385 | a/c 0.816/ 0.816 | S-1 0.816 |
| 13 | D | 3.42 | P-4 | 1.33 | c/d 0.816/ 0.816 | S-1 0.816 |
| 14 | B/C | 1.13/ 2.65 | P-4 | 1.26 | a/c 0.864/ 1.296 | |
| 15 | A/C | 1.24/ 2.89 | P-4 | 0.907 | a 1.512 | S-3 0.648 |
| Comparative Example | | | | | | |
| 1 | B | 3.73 | P-3 | 1.31 | e 2.16 | none |
| 2 | B | 3.73 | P-3 | 1.31 | f 2.16 | none |

P-1: 1-[α-Methyl-α-(4'-hydroxyphenyl)ethyl]-4-[α',α'-bis(4"-hydroxyphenyl)ethyl]benzene P-2: Tris(4-hydroxyphenyl)methane P-3: 1,1-Bis(4-hydroxyphenyl)cyclohexane P-4: Bis(2,5-dimethyl-4-hydroxyphenyl)-2'-hydroxyphenylmethane P-5: 2,6-Bis(2'-hydroxy-5-methylbenzyl)-4-methylphenol S-1: 1,2-Naphthoquinonediazide-5-sulfonic acid esterified product (two equivalent) of 1,1-bis{3-(4'-hydroxybenzyl)-4-hydroxy-5-methylphenyl}cyclohexane S-2: 1,2-Naphthoquinonediazide-5-sulfonic acid esterified product (two equivalent) of 2,6-bis(4'-hydroxybenzyl)-4-cyclohexylphenol S-3: 1,2-Naphthoquinonediazide-5-sulfonic acid esterified product (two equivalent) of methylenebis{2-(4'-hydroxy-3'-cyclohexylbenzyl)-6-methylphenol}

TABLE 2

| | Sensitivity | Resolution (μm) | Film Thickness Dependency | Development Residue | Exposure Margin |
|---|---|---|---|---|---|
| Example | | | | | |
| 1 | 2.22 | 0.33 | 0.89 | A | 0.320 |
| 2 | 2.78 | 0.33 | 0.86 | A | 0.292 |
| 3 | 1.43 | 0.31 | 0.96 | A | 0.340 |
| 4 | 1.39 | 0.31 | 0.93 | A | 0.381 |
| 5 | 1.67 | 0.31 | 0.95 | A | 0.335 |
| 6 | 1.37 | 0.30 | 0.94 | A | 0.386 |
| 7 | 1.14 | 0.29 | 0.92 | A | 0.410 |
| 8 | 1.37 | 0.29 | 0.90 | A | 0.391 |
| 9 | 1.09 | 0.32 | 0.92 | A | 0.443 |
| 10 | 1.19 | 0.32 | 0.93 | A | 0.420 |
| 11 | 1.09 | 0.30 | 0.96 | A | 0.452 |
| 12 | 1.02 | 0.30 | 0.95 | A | 0.429 |
| 13 | 1.04 | 0.29 | 0.92 | A | 0.437 |

TABLE 2-continued

| | Sensitivity | Resolution (μm) | Film Thickness Dependency | Development Residue | Exposure Margin |
|---|---|---|---|---|---|
| 14 | 1.32 | 0.29 | 0.95 | A | 0.400 |
| 15 | 1.39 | 0.31 | 0.90 | A | 0.365 |
| Comparative Example | | | | | |
| 1 | 1.02 | 0.35 | 0.80 | A | 0.195 |
| 2 | 1.00 | 0.35 | 0.82 | B | 0.180 |

As seen from the results, the resists using the photosensitive materials of the present invention exhibited high sensitivity, good resolution, resist performance less dependent on the film thickness, and good exposure margin.

The present invention can provide a positive photoresist for ultrafine working ensuring high sensitivity, high resolution, improved film thickness dependency, and improved exposure margin.

While the invention has been described in detail with reference to specific embodiments, it will be apparent to one skilled in the art that various changes and modifications can be made to the invention without departing from its spirit and scope.

What is claimed is:

1. A positive photoresist composition comprising an alkali-soluble resin and a 1,2-naphthoquinonediazide-5-(and/or -4-)sulfonic ester of a polyhydroxy compound represented by the following formula (I), the tetraester component of the 1,2-naphthoquinonediazide-5-(and/or -4-) sulfonic ester of the polyhydroxy compound represented by formula (I) accounting for 50% or more of the entire pattern area determined by high-performance liquid chromatography using ultraviolet rays of 254 nm:

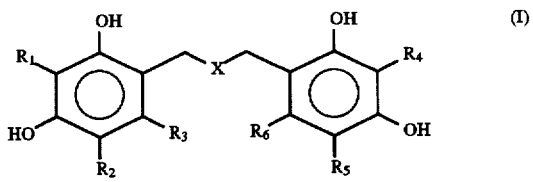

wherein X represents

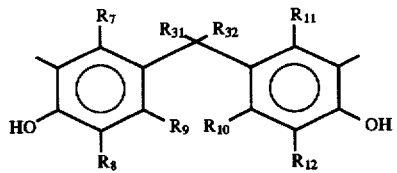

or

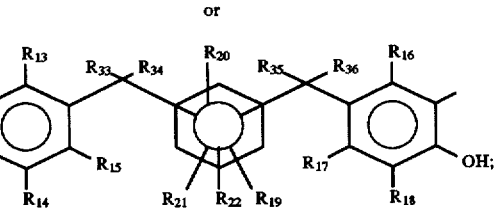

$R_1$ to $R_{18}$, which may be the same or different, each represents a hydrogen atom, a halogen atom, an alkyl group having 1 to 4 carbon atoms, a cycloalkyl group, or an alkenyl group;

$R_{19}$ and $R_{20}$, which may be the same or different, each represents a hydrogen atom, a halogen atom, an alkyl group having 1 to 4 carbon atoms, or an alkenyl group;

$R_{21}$ represents a hydrogen atom, a hydroxyl group, a halogen atom, an alkyl group having 1 to 4 carbon atoms, or an alkenyl group;

$R_{22}$ represents a hydrogen atom, a halogen atom, an alkyl group having 1 to 4 carbon atoms, a cycloalkyl group, an alkenyl group, an alkoxy group; and $R_{31}$ to $R_{36}$, which may be the same or different, each represents a hydrogen atom or an alkyl group having 1 to 4 carbon atoms, and $R_{31}$ and $R_{32}$, $R_{33}$ and $R_{34}$, or $R_{35}$ and $R_{36}$ may be combined to form a 4 or 5-membered cycloalkane.

2. The positive photoresist composition of claim 1, wherein $R_1$ to $R_6$ each represents a hydrogen atom, a chlorine atom or a methyl group.

3. The positive photoresist composition of claim 1, wherein $R_7$ to $R_{18}$ each represents a hydrogen atom, a chlorine atom, a methyl group, an ethyl group, a cyclohexyl group, or an allyl group.

4. The positive photoresist composition of claim 1, wherein $R_{31}$ to $R_{36}$ each represents a hydrogen atom, a methyl group, an ethyl group or an isopropyl group.

5. The positive photoresist composition of claim 1, wherein $R_{19}$ and $R_{20}$ each represents a hydrogen atom, a chlorine atom, a methyl group, an ethyl group, a cyclohexyl group or an allyl group.

6. The positive photoresist composition of claim 1, wherein $R_{21}$ each represents a hydrogen atom, a hydroxy group, a methyl group, an ethyl group, a cyclohexyl group or an allyl group.

7. The positive photoresist composition of claim 1, wherein $R_{22}$ each represents a hydrogen atom, a chlorine atom, a methyl group, an ethyl group, a cyclohexyl group or a methoxy group.

8. The positive photoresist composition of claim 1, wherein the tetraester component of the 1,2-naphthoquinonediazide-5-(and/or -4-)sulfonic ester of the polyhydroxy compound represented by formula (I) accounts for 60% or more of the entire pattern area determined by high-performance liquid chromatography using ultraviolet rays of 254 nm.

9. The positive photoresist composition of claim 1, wherein the amount of the 1,2-naphthoquinonediazide-5-(and/or -4-)sulfonic ester of a polyhydroxy compound represented by formula (I) is 5 to 100 parts by weight per 100 parts by weight of the alkali-soluble resin.

* * * * *